(12) United States Patent
de Buda

(10) Patent No.: US 6,965,225 B2
(45) Date of Patent: Nov. 15, 2005

(54) CORELESS CURRENT SENSOR

(75) Inventor: Eric George de Buda, Toronto (CA)

(73) Assignee: Kinectrics Inc., Toronto (CA)

( * ) Notice: Subject to any disclaimer, the term of this patent is extended or adjusted under 35 U.S.C. 154(b) by 0 days.

(21) Appl. No.: 10/609,486

(22) Filed: Jul. 1, 2003

(65) Prior Publication Data
US 2004/0257061 A1 Dec. 23, 2004

(30) Foreign Application Priority Data
Jun. 17, 2003 (CA) ................................. 2432671

(51) Int. Cl.$^7$ ................................. G01R 19/00
(52) U.S. Cl. ...................... 324/117 R; 324/126
(58) Field of Search ................ 324/117 R, 117 H, 324/126, 127; 336/173, 174, 208, 225

(56) References Cited

U.S. PATENT DOCUMENTS

| | | | |
|---|---|---|---|
| 3,626,291 A | * 12/1971 | Yauch et al. ............... 324/127 |
| 4,709,205 A | 11/1987 | Baurand et al. ............ 324/127 |
| 4,855,671 A | * 8/1989 | Fernandes .................. 324/127 |
| 5,414,400 A | 5/1995 | Gris et al. .................. 336/174 |
| 6,271,655 B1 | 8/2001 | Weber et al. ............... 324/117 R |
| 6,624,624 B1 | * 9/2003 | Karrer et al. ............... 324/117 R |
| 2003/0112000 A1 | 6/2003 | Sorenson, Jr. ............... 324/126 |

* cited by examiner

Primary Examiner—Vincent Q. Nguyen
(74) Attorney, Agent, or Firm—Dimock Stratton LLP; Mark B. Eisen

(57) ABSTRACT

A time varying current sensor is constructed using surface coils uniformly spaced around a central cavity adapted to receive the conductor through which the current to be measured flows. Accurate and uniform coil geometry is achieved using printed circuit board technology, thereby eliminating the high cost of precision toroidal coil winding. An optional hinge in the housing can allow the sensor to be easily installed on existing conductors without the need to disconnect and reconnect.

24 Claims, 5 Drawing Sheets

CORELESS CURRENT SENSOR

FIELD OF THE INVENTION

This invention relates to the measurement of time-varying electric currents, and more particularly to a coreless current sensor constructed using surface coils.

BACKGROUND OF THE INVENTION

In the prior art toroidal current transformers are well established as a method of measuring alternating currents. Referring now to FIG. 1, these devices typically consist of a toroidal ferromagnetic core and a coil. The coil, consisting of insulated copper wire, is wound around the core, usually in a way that conforms to the toroidal shape of the core. Alternating current in a conductor which passes through the center of the core creates a changing magnetic field which in turn induces a voltage at the coil terminals. This voltage provides a measure of the current in the conductor. If high accuracy is required or if the frequency is not constant, this voltage can be integrated by an analog integrator to give a more accurate measure of the current.

In theory if the coil and the core are toroidal and perfectly uniform and if the coil has an infinite number of turns, then the output voltage is unaffected by the position of the conductor passing through the center of the core. In other words the conductor does not need to be accurately centered to provide an accurate current measurement. In addition, the output voltage is unaffected by external fields produced by nearby currents which do not flow through the inside of the core. In practice, as long as the core is uniform and has a high magnetic permeability, the coil does not need to be uniform and does not need to have very many turns. Nevertheless, it may be advantageous to have a large number of turns in order to produce a large signal.

There are a number of drawbacks to this kind of current sensor. The presence of the ferromagnetic core will change the impedance of the AC conductor. Also, ferromagnetic cores can saturate and in the process produce non-linear signals. To prevent this, an electrical load or burden is often connected to the output terminals.

While such a sensor may be suitable for permanent installations, the need to string the conductor through the core can cause difficulties when retrofitting is required. Some current transformers have a split core to allow for easy installation. The problem with this is that the overall magnetic permeability of the core, and therefore the output signal, is affected by small variations in the gaps where the two halves of the split core meet. This variation can be greatly reduced by making the gaps large, but the consequences of this is that the overall magnetic permeability of the core is greatly reduced and many more turns are then required in the coil to produce the same signal output. Also, if the magnetic permeability of the core is lower, then the uniformity of the coil windings becomes more important.

Coil winding adds significantly to the cost of such a sensor. This cost is higher if more turns are required, and can be especially high if uniform winding is necessary. The winding of toroidal coils is especially expensive, particularly if a high-level of uniformity is required.

U.S. Pat. No. 4,709,205, issued Nov. 24, 1987 to Baurand et al., which is incorporated herein by reference, shows an attempt to address some of these problems. To eliminate saturation, hysteresis, and other non-linear effects of ferromagnetic cores, they produced a coreless sensor. To eliminate the cost of a toroidally wound core, they arrange four linear coils in the shape of a square to enclose the AC conductor. This arrangement is somewhat sensitive to the position of the AC conductor and to external fields, and this is partly addressed by having a small opening for the conductor which restricts it from moving too far off center. This limits the range of conductor sizes that are suitable for use with this sensor. Also, there is a problematic trade-off between signal strength and the cost of the coils. If the coils have few turns, they can be made relatively inexpensively, however, the signal output is then very weak. The signal output can be greatly increased by increasing the number turns, but this greatly increases the cost because a greater number of turns makes it more difficult to maintain a uniform winding. If the winding is not uniform, then the sensor is more sensitive to the position of the AC conductor, and to external fields and this can lead to increased signal error. Even if the coils are perfectly wound for this geometry, there will be some sensitivity to these sources of error, because four linear coils do not form a true toroid.

U.S. Pat. No. 5,414,400, issued May 9, 1995 to Gris et al., which is incorporated herein by reference, proposes a toroidal coil produced as a printed circuit board. While this greatly reduces the cost, it does suffer from certain difficulties. For example, the resolution of the printed circuit board production process limits the number of turns possible for a given size of sensor. Furthermore, the capture area of each coil is very small, being limited by the radial length of the coil and the thickness of the printed circuit board. As a result, the signal from the sensor is very weak. They have proposed to address this by stacking a number of these printed circuit boards together and combining their signals. However, if a large number of circuit boards are used, this detracts from the cost savings, and still results in a signal that is quite weak. This is because the geometry that they have chosen is quite inefficient in terms of the coil capture area achieved for the amount of printed circuit board required by the coil.

Another problem is that the AC conductor must be strung through the center of the sensor. This means that an existing circuit would have to be disconnected in order to install the sensor. It would of course be possible to modify their printed circuit board design such that the toroid is split in two halves. However, to prevent shorting, it would be necessary to have a gap in the conductor traces where the two halves meet. Such a gap would be a source of non-uniformity and make the sensor sensitive to the position of the AC conductor and to external fields. The effect of the non-uniformity could be reduced by making equivalent gaps evenly spaced around the circumference, but the effect of this would be to further reduce the already low amount of coil capture area.

U.S. Pat. No. 6,271,655, issued Aug. 7, 2001 to Weber et al., which is incorporated herein by reference, presents a current transformer based on a planar coil etched onto a printed circuit board. Said planar coil is in fact a surface coil wherein in this case the surface on which the coil is disposed is planar (or a plane). While they have clearly presented a much more efficient coil geometry, this non-toroidal sensor is particularly sensitive to the position of the AC conductor. This problem is addressed by making the AC conductor a pair of traces on the opposite side of the printed circuit board. Thus, motion of the AC conductor is not possible relative to the sense coil, and it is therefore prevented from being a source of error. While this is not a problem for a device which is assembled into a new product being manufactured, it does make it very inconvenient for use as a general-purpose instrument, or as a sensor which needs to be retrofitted onto an existing conductor. Also, since the AC current must pass through a trace on a printed circuit board, this device is limited to measuring relatively small current levels. Furthermore, because this geometry does not even begin to approach that of a toroid, it can be expected to have a very high level of sensitivity to external fields which cause noise.

SUMMARY OF THE INVENTION

It is an object of the present invention to provide a current sensor which is easily installed around an existing conductor without disconnecting the conductor. It is a further object of the present invention to provide a current sensor which can accommodate a range of different conductor sizes. It is a yet further object of the present invention to provide a current sensor which is accurate, provides a relatively large signal output, is inexpensive to manufacture, reduces or eliminates some or all of the disadvantages associated with ferromagnetic cores, and is not sensitive to external fields.

According to a preferred embodiment of this invention, a plurality of radially oriented surface coils are interconnected and arranged preferably substantially equally spaced around a central cavity and mounted in a hinged housing.

The present invention thus provides a current sensor comprising a plurality of surface coils substantially uniformly spaced around a central cavity and substantially equidistant from said cavity, said cavity having been designed to accept a conductor through which the current to be measured flows, said coils being oriented to have symmetry with respect to the central axis of said cavity, said coils being electrically interconnected such that the output voltages of said coils are combined and applied to the terminals of said sensor.

The present invention further provides a current sensor for measuring a time varying current flowing through a conductor, comprising: a plurality of surface coils, at least some of said coils being substantially uniformly spaced around a central cavity for receiving the conductor, and substantially equidistant from said cavity, said substantially uniformly spaced coils being oriented substantially axially and radially relative to an axis of said cavity, at least some of said substantially uniformly spaced coils being electrically interconnected such that output voltages of said coils are combined and applied to output terminals of said sensor.

The present invention further provides, for a current sensor for measuring a time varying current flowing through a conductor, a coil comprising a substrate having a first surface and a second surface, the first surface being opposite to the second surface, the first surface being provided with at least one surface coil and the second surface being provided with at least one surface coil, wherein said surface coils on both said surfaces are interconnected.

BRIEF DESCRIPTION OF THE DRAWINGS

In drawings which illustrate preferred embodiments of the invention by way of example only.

DETAILED DESCRIPTION OF THE INVENTION

Figure 1:
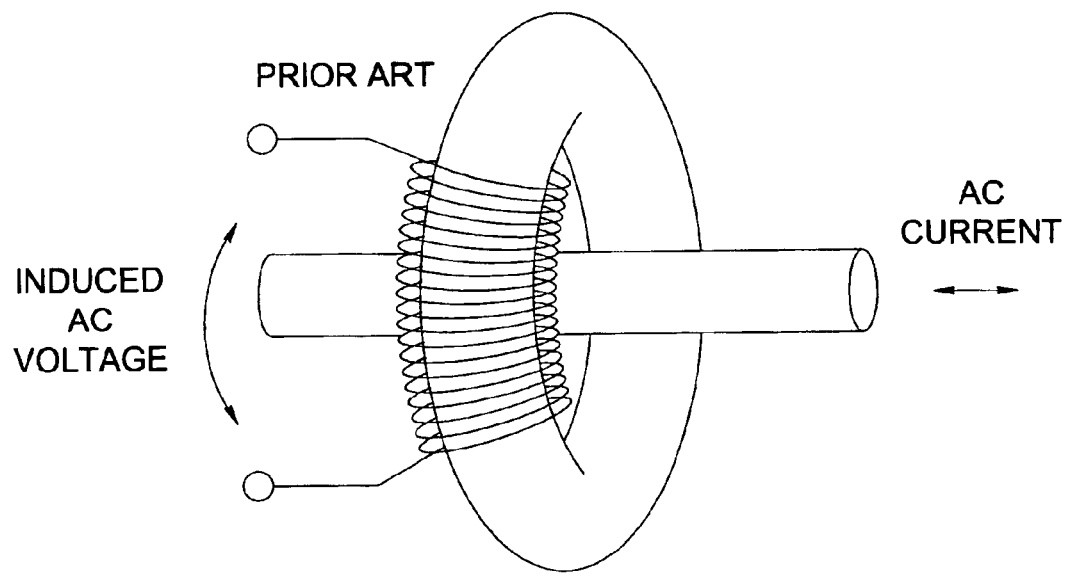
FIG. 1 is a perspective view of the components of a typical current transformer in accordance with the prior art.
Figure 2:
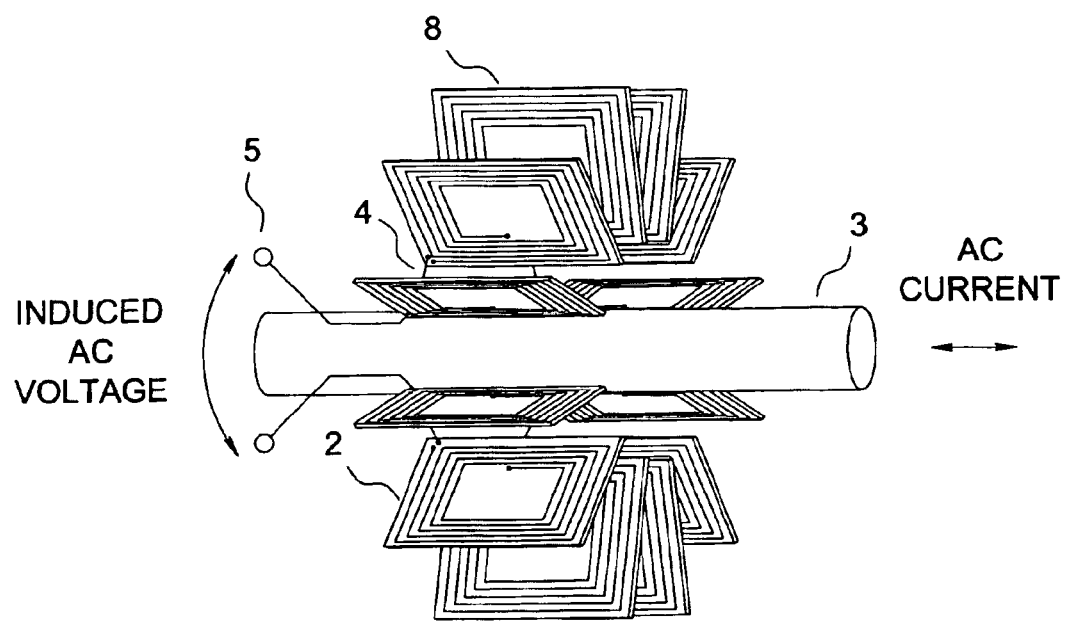
FIG. 2 is a perspective view of the components of a current sensor in accordance with the present invention.

Referring now to FIG. 2, a plurality of surface coils 2 is arranged around a central cavity for receiving an AC current carrying conductor 3. For simplicity of manufacture, each coil 2 may be printed onto a circuit board 8 or other suitable substrate. Preferably the coils 2 are substantially equally or at least uniformly spaced.

Although optimum results may be obtained with equal spacing, near optimum results can be achieved with unequal spacing as long as the spacing is uniform. For example, a sensor with 18 surface coils with a spacing of 20 degrees between adjacent coils would be equally and uniformly spaced, but if the spacing alternated between 10 degrees and 30 degrees, e.g. 10,30,10,30 . . . the coils would not be equally spaced, but would still be uniformly spaced. To better understand why, one could imagine two sets of equally spaced coils being interleaved. Each set would possess the benefits of a toroidal geometry, and therefore would possess the same in combination with each other regardless of their relative orientation to each other.

Interconnecting wires 4 connect the coils 2 to each other, and to output terminals 5. In the simplest case, each coil can be interconnected to its adjacent coil around the entire circumference with the exception of the two adjacent boards at which the signal output is measured. It is, however, advantageous to interconnect the coils in the manner illustrated in FIG. 10, as two separate banks of coils. This allows for easier installation around an existing conductor, and also enables the cancellation of the orthogonal loop formed by the interconnecting wires 4. Such an orthogonal loop would make the sensor more susceptible to external magnetic fields causing noise or signal error.

Alternating current in conductor 3 generates a varying magnetic field, which induces a voltage in the surface coils 2. Output terminals 5 receive the sum of the signal voltages produced by the individual coils 2.

In the embodiment illustrated in FIG. 2 the surfaces on which the coils 2 are disposed are substantially planar. However, it will be appreciated that the coils 2 can be disposed on curvate surfaces; for example the coils 2 can be printed or otherwise mounted on a curved circuit board or other substrate surface. It will also be appreciated that although in the embodiment shown each coil 2 is mounted onto the exterior face of the circuit board 8, it is also possible for the surface coil 2 to be printed on an interior surface of a multi-layer circuit board, or cast or embedded within a substrate board, without affecting the performance of the device of the invention.

Figure 3:
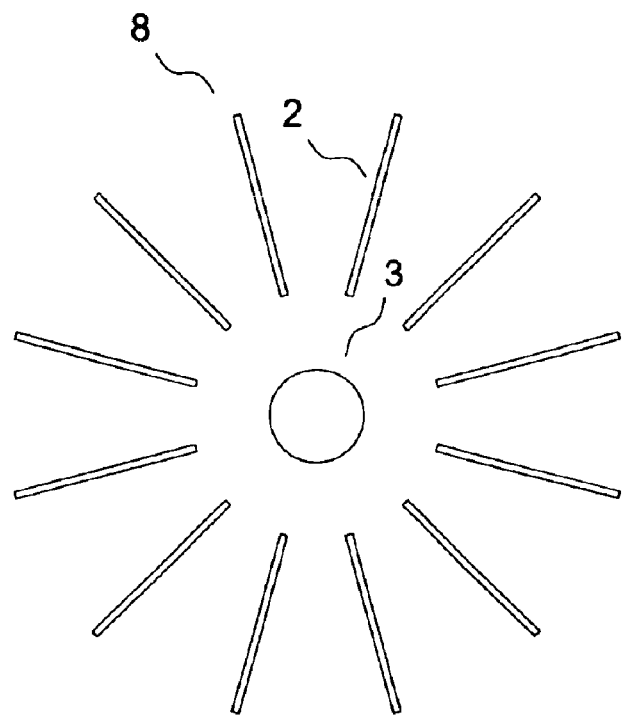
FIG. 3 is an end elevation showing the arrangement of surface coils around the AC conductor in the preferred embodiment of the invention.

Referring now to FIG. 3, it can be seen that the surface coils 2 are arranged in a radial orientation, like the spokes of a wheel around the AC conductor 3. The surface coils 2 are also oriented axially relative to an axis of the conductor 3. A small number of coils 2 is shown for the sake of clarity, however a larger number of coils is possible and may be advantageous.

Figure 4:
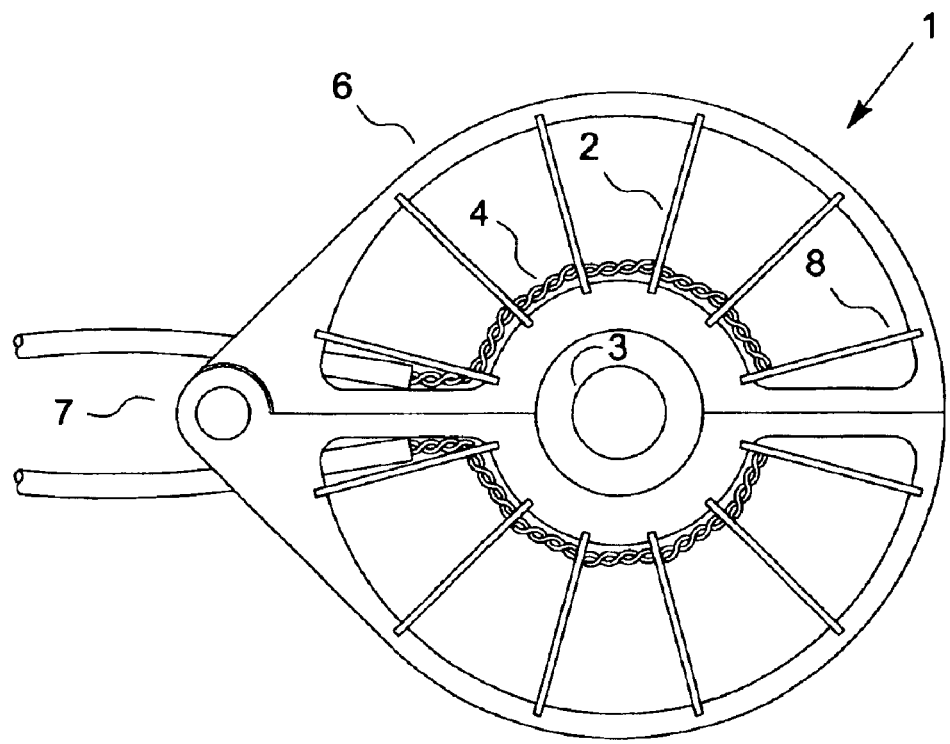
FIG. 4 is an end elevation showing the hinged housing in the closed condition.

Referring now to FIG. 4, the current sensor 1 comprises surface coils 2 mounted on circuit boards 8 that are in turn mounted in a hinged housing 6 which surrounds AC current carrying conductor 3. Twisted pair interconnect wires 4 connect the surface coils 2 to signal cables coupled to output terminals.

Figure 5:
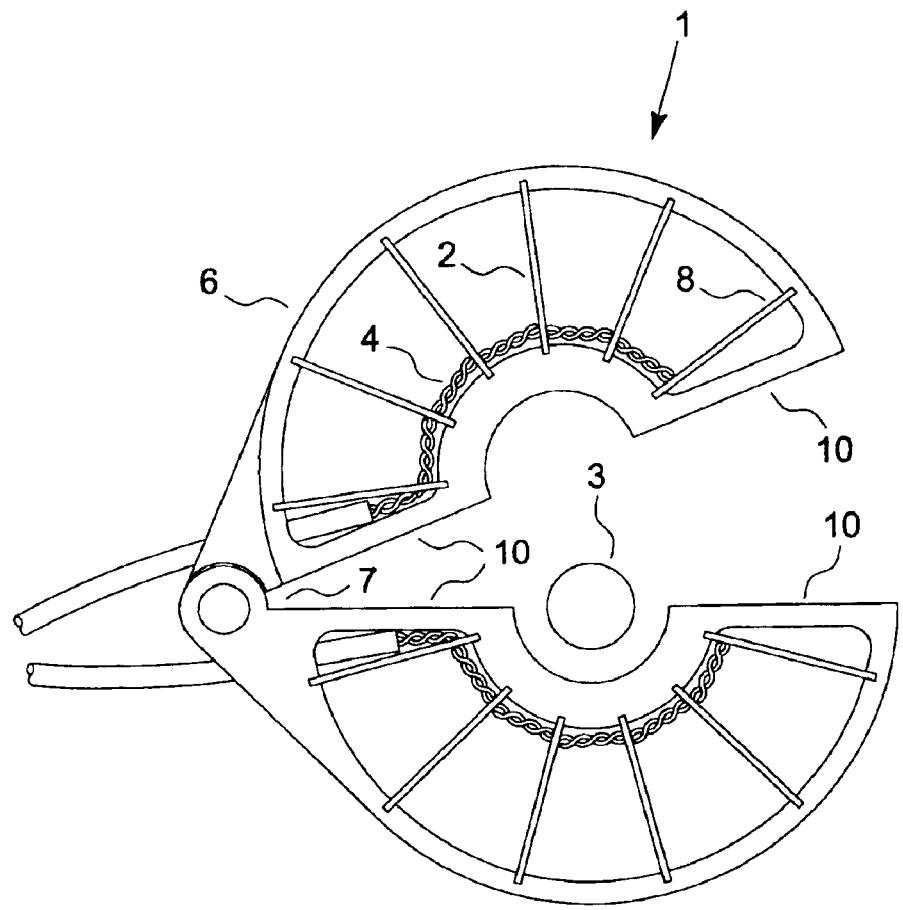
FIG. 5 is an end elevation showing the hinged housing in an open condition for installation onto or removal from an existing conductor.

Referring now to FIG. 5, the hinged housing 6 of the current sensor 1 is opened to allow installation onto an existing AC conductor 3. The coil geometry makes it possible to keep the conductors of the surface coils 2 away from the mating surfaces 10 without introducing any imbalance or asymmetry, which could adversely affect the sensor accuracy. This is advantageous because coil conductors close to the mating surfaces 10 would make the sensor vulnerable to scratches on these surfaces. Small changes in the gaps between these surfaces will have a small effect on the sensor accuracy, however, this effect will be orders of magnitude less than it would be if there were a ferromagnetic core.

The same coil geometry also allows for a break in the interconnecting wires 4 between the two coils 2 adjacent to the portion of the housing 6 that opens. Thus, the sensor 1 can be placed over the conductor 3 without the interference of the interconnecting wires 4 forming an obstruction.

Figure 6:
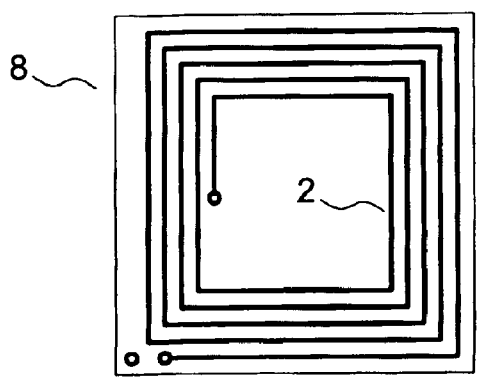
FIG. 6 is a plan view of one face of a surface coil printed on a circuit board.
Figure 7:
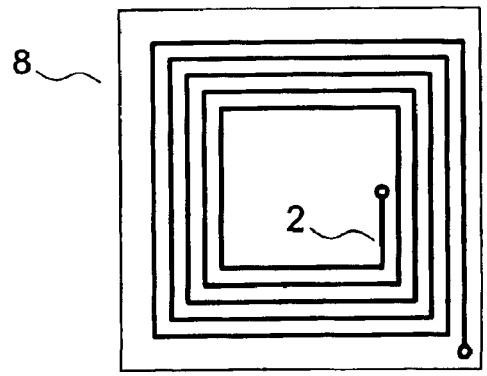
FIG. 7 is a plan view of the opposite face of the printed circuit board of FIG. 6.

Referring now to FIG. 6, a surface coil 2 is shown as a pattern of traces on one side of a printed circuit board 8. Referring now to FIG. 7, a surface coil 2 on the opposite side of the board 8 is shown. In these illustrations only a few loops for the coil are shown for the sake of clarity, but in practice it is possible to have many more loops. The two coils 2 on this printed circuit board are preferably connected to each other through a via, or plated drilled hole, in such a way that the opposed coils 2 are connected in series so that the voltages induced in the two coils 2 will reinforce each other rather than cancel each other out. It can be seen from these figures that the amount of printed circuit board area occupied by a single turn of the surface coil is very small compared to the area enclosed by the turn. This is in contrast to the prior art toroidal printed circuit coil described earlier, wherein this is not the case. The advantage conferred by this is that a far greater coil capture area can be achieved for the same amount of printed circuit board, or for the same size of sensor. Indeed, it can be shown that the present invention can be designed to be at least one order of magnitude superior in this regard. This translates into a signal output at least one order of magnitude larger, all other things being equal, for the size of the sensor presented in the prior art as referred to earlier, assuming a printed circuit board thickness of one sixteenth of an inch. If a smaller printed circuit board thickness is used, this advantage becomes even more pronounced, because the number of surface coils 2, and therefore the number of turns possible in a given sensor size with the present invention, is inversely proportional to the printed circuit board thickness. These advantages are not shared by the prior art.

Figure 8:
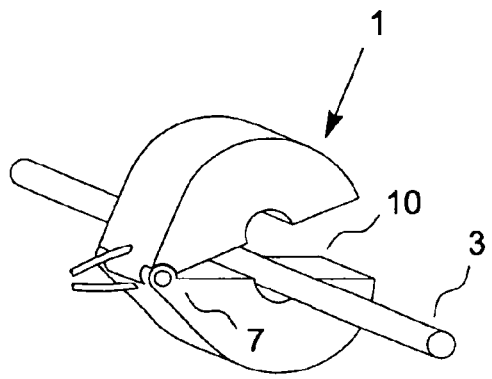
FIG. 8 is a perspective view of the sensor of the invention in an open condition, being installed onto an existing conductor.
Figure 9:
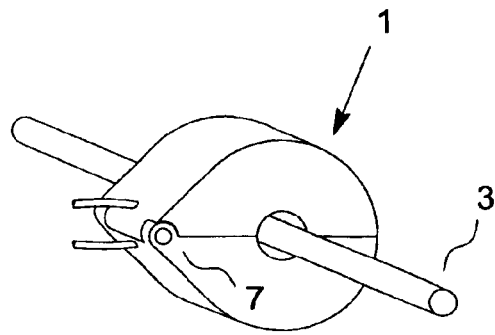
FIG. 9 is a perspective view of the sensor of the invention in a closed condition, having been fully installed onto an existing conductor.

FIG. 8 shows the coreless current sensor 1 in the process of being installed on conductor 3. In the preferred embodiment this is facilitated by the hinge 7 which allows the to sensor halves to spread apart. As a result there is no need to disconnect and then reconnect conductor 3. In FIG. 9, the hinge is closed and accurate current measurements with the sensor 1 are now possible. It should be noted that the sensor 1 is capable of picking up current in a conductor 3 with the hinge open, but unless the hinge is closed the measurement will not be accurate. The hinge 7 can be held closed by a torsion spring, or latch, or other means (not shown), which will be readily apparent to those skilled in the art.

Figure 10:
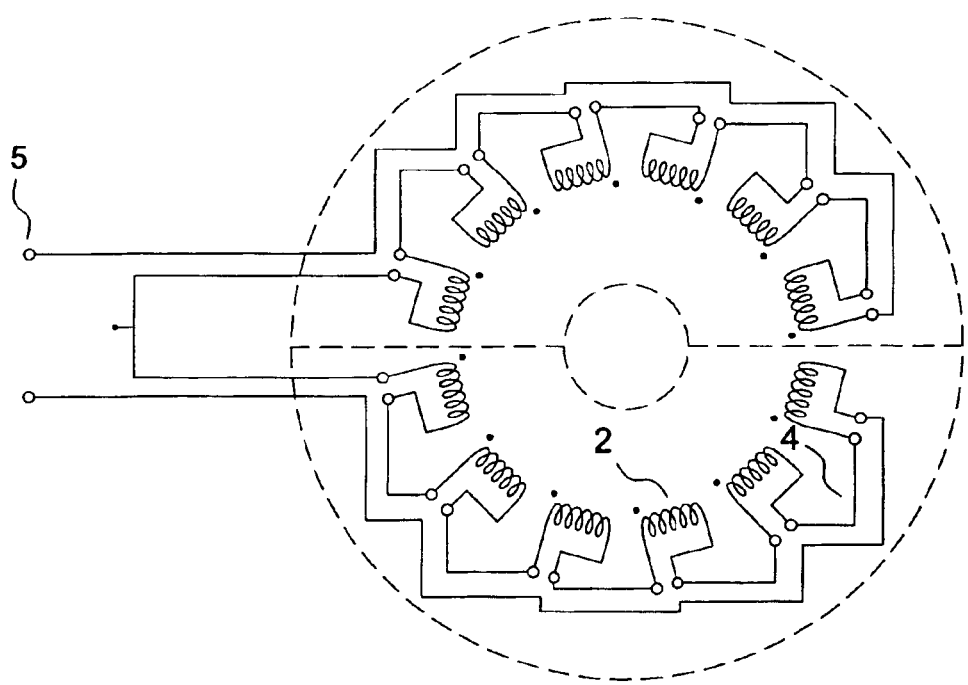
FIG. 10 is a schematic diagram showing the interconnection of the coils in the embodiment of FIG. 4.

Referring now to FIG. 10, it is shown in this schematic diagram how the surface coils 2 are connected to each other by interconnecting wires 4 and to the output wires, which lead to the output terminals 5. The surface coils 2 are all preferably connected in series in such a way that all of the induced voltages will add to the final result and none will subtract from it. Although it is not shown in the schematic diagram for the sake of clarity, it may be advantageous if the interconnecting wires 4 are implemented as twisted pairs, as shown in FIGS. 4 and 5, as this may reduce spurious or interfering signals.

Figure 11:
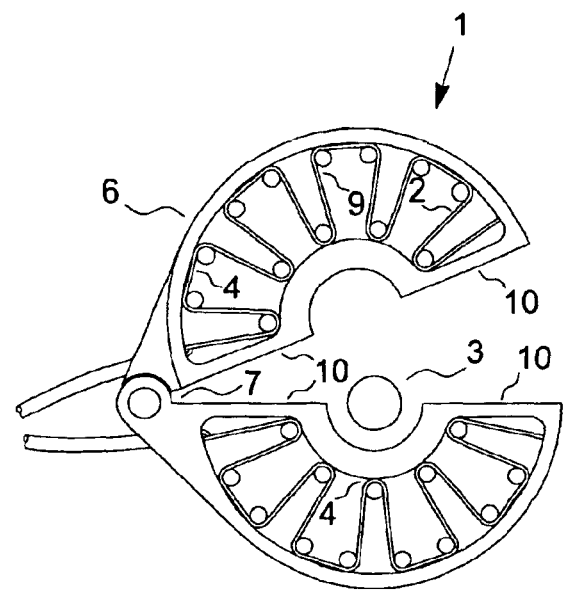
FIG. 11 is an end elevation of an alternative embodiment of the invention using a flexible printed circuit.

Referring now to FIG. 11, an alternative embodiment is shown wherein the surface coils 2 are disposed on a flexible substrate, for example a flexible printed circuit substrate 9. One advantage of this is that the interconnections 4 between the surface coils 2 are part of the printed circuit substrate 9, thereby reducing assembly costs. While the spacing of the coils is not equal, given that the amount of spacing alternates between larger and smaller, it is uniform, and therefore as explained earlier, the benefits of a toroidal geometry are maintained.

Figure 12:
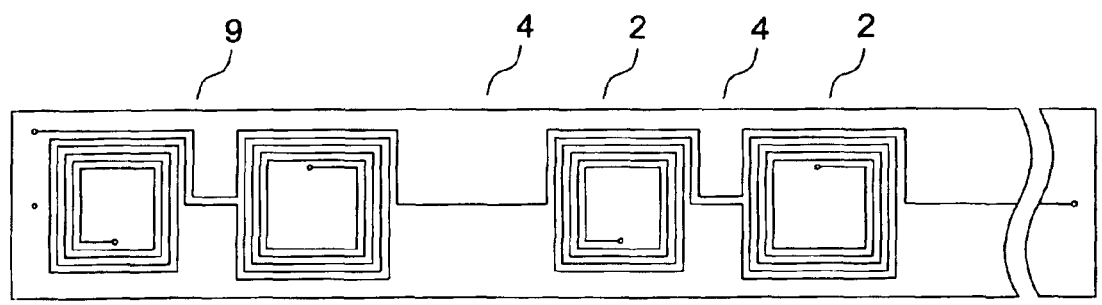
FIG. 12 is a plan view of one face of the flexible printed circuit of FIG. 11.
Figure 13:
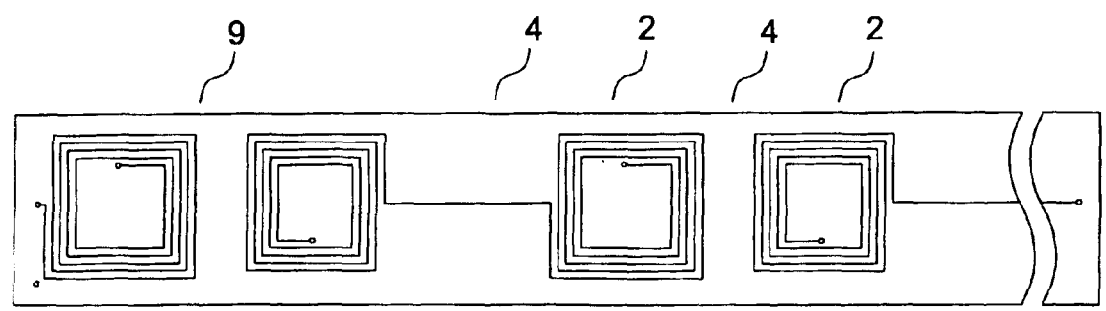
FIG. 13 is a plan view of the opposite face of the flexible printed circuit of FIG. 11.

Referring now to FIG. 12, one side of the flexible printed circuit substrate 9 is shown with an example of how the surface coils 2 can be arranged. Spaces for interconnections 4 are left between the surface coils 2. Due to the geometry of the sensor 1, the interconnections 4 are shorter when closer to the center, but longer when farther away. The reverse side of the flexible printed circuit substrate 9 is shown in FIG. 13. For the sake of clarity, not all coils 2 are shown in FIGS. 12 and 13, however, it will be understood that the same pattern repeats itself.

Preferred embodiments of the invention having been thus described by way of example only, it will be appreciated that various modifications and adaptations may be made without departing from the scope of the invention as set out in the appended claims.

I claim:

1. A current sensor for measuring a time varying current flowing through a conductor, comprising:
    a plurality of discrete planar insulating substrates substantially equidistant from a central cavity for receiving the conductor, said planar substrates being spaced apart from each other and aligned with angularly spaced planes that are oriented in substantially axial and radial directions relative to the axis of said cavity, and with at least one surface coil having at least one complete turn defined on a single surface of each said substrate, said coils being electrically interconnected such that output voltages of said coils are combined and applied to output terminals of said sensor, wherein at least a plurality of the coils on separate substrates are interconnected with each other with twisted pair wire.

2. A current sensor according to claim 1 wherein each said surface coil comprises a conductive track on the surface of the substrate.

3. A current sensor according to claim 2 wherein at least one surface coil is provided on an opposite surface of the substrate.

4. A current sensor according to claim 3 wherein at least two surface coils on opposite surfaces of the substrate are connected through a via.

5. A current sensor according to claim 2 wherein each said surface coil includes a plurality of nested conductive turns, of progressively smaller size, one within another, on the surface of the substrate.

6. A current sensor according to claim 5 wherein the amount of substrate area occupied by a turn is very small compared to the area enclosed by said turn.

7. A current sensor according to claim 1 wherein the substrates are all spaced at equal angles.

8. A current sensor according to claim 7 further comprising a housing in which the coils are disposed, the housing being divided into at least two sections, such that said sections maybe spread apart, to allow entry of said conductor into said cavity.

9. A current sensor according to claim 8, wherein the mating surfaces of the two sections are located between substrates, so as to provide a separation distance between the mating surfaces and the coil conductors.

10. A current sensor according to claim 1 wherein the substrates are uniformly spaced at unequal angles, while oriented with symmetry about the axis of the central cavity.

11. A current sensor according to claim 10 further comprising a housing in which the coils are disposed, the housing being divided into at least two sections, such that said sections may be spread apart, to allow entry of said conductor into said cavity.

12. A current sensor according to claim 11, wherein the mating surfaces of the two sections are located between substrates, so as to provide a separation distance between the mating surfaces and the coil conductors.

13. A current sensor for measuring a time varying current flowing through a conductor, comprising:
 a plurality of planar insulating substrate elements substantially equidistant from a central cavity for receiving the conductor, said substrate elements being spaced apart from each other and aligned with angularly spaced planes that are oriented in substantially axial and radial directions relative to the axis of said cavity, and with at least one surface coil having at least one complete turn defined on a single surface of each said substrate element, said coils being electrically interconnected such that output voltages of said coils are combined and applied to output terminals of said sensor, wherein at least a plurality of the substrate elements are integral with each other, being sections of a flexible substrate strip.

14. A current sensor according to claim 13 wherein each surface coil comprises a track on the surface or the substrate strip and electrical interconnections between the coils are defined by tracks on the substrate strip.

15. A current sensor according to claim 14 wherein at least one surface coil is provided on an opposite surface of the substrate element.

16. A current sensor according to claim 15 wherein at least two surface coils on opposite surface of the substrate element are connected through a via.

17. A current sensor according to claim 14 wherein each said surface coil includes a plurality of nested conductive turns, of progressively smaller size, one within another, on the said surface of the substrate element.

18. A current sensor according to claim 17 wherein the amount of substrate area occupied by a turn is very small compared to the area enclosed by said turn.

19. A current sensor according to claim 13 wherein the substrate elements are all spaced at equal angles.

20. A current sensor according to claim 19 further comprising a housing in which the coils are disposed, the housing being divided into at least two sections, such that said sections may be spread apart, to allow entry of said conductor into said cavity.

21. A current sensor according to claim 20 wherein the mating surfaces of the two sections are located between substrate elements, so as to provide a separation distance between the mating surfaces and the coil conductors.

22. A current sensor according to claim 13 wherein the substrate elements are uniformly spaced at unequal angles, while oriented with symmetry about the axis of the central cavity.

23. A current sensor according to claim 22 further comprising a housing in which the coils are disposed, the housing being divided into at least two sections, such that said sections may be spread apart, to allow entry of said conductor into said cavity.

24. A current sensor according to claim 23 wherein the mating surfaces of the two sections are located between substrate elements, so as to provide a separation distance between the mating surfaces and the coil conductors.

* * * * *